United States Patent [19]
Tanaka

[11] Patent Number: 5,177,570
[45] Date of Patent: Jan. 5, 1993

[54] MOS SEMICONDUCTOR DEVICE WITH HIGH DIELECTRIC CONSTANT SIDEWALL INSULATOR AND INDUCED SOURCE/DRAIN EXTENSION

[75] Inventor: Takeshi Tanaka, Yokohama, Japan
[73] Assignee: Kabushiki Kaisha Toshiba, Kanagawa, Japan
[21] Appl. No.: 738,538
[22] Filed: Jul. 31, 1991
[30] Foreign Application Priority Data
  Aug. 1, 1990 [JP] Japan .................. 2-204538
[51] Int. Cl.$^5$ .............. H01L 29/78; H01L 29/06; H01L 29/86
[52] U.S. Cl. .................. 257/345; 257/344; 257/900
[58] Field of Search .......... 357/23.3, 23.9, 23.12, 357/23.15, 59

[56] References Cited
U.S. PATENT DOCUMENTS

| | | |
|---|---|---|
| 4,488,162 | 12/1984 | Jambotkar ............ 357/59 G |
| 4,638,347 | 1/1987 | Iyer ....................... 357/59 G |
| 4,908,326 | 3/1990 | Ma et al. .................. 357/23.3 |
| 4,998,161 | 3/1991 | Kimura et al. ............ 357/23.3 |
| 5,047,361 | 9/1991 | Matloubian et al. ....... 357/23.3 |
| 5,102,816 | 4/1992 | Manukonda et al. ..... 357/23.3 |
| 5,108,940 | 4/1992 | Williams .................. 357/23.3 |
| 5,119,152 | 6/1992 | Mizuno .................... 357/23.3 |

FOREIGN PATENT DOCUMENTS 1340200 7/1986 Japan .

*Primary Examiner*—Gene M. Munson
*Attorney, Agent, or Firm*—Banner, Birch, McKie & Beckett

[57] ABSTRACT

A gate insulating film 22 made of a silicon oxide film is formed on the surface of a substrate 21. A gate electrode 23 is formed on the gate insulating film 22. Insulating films 24 made of silicon nitride films are formed on side walls of the gate electrode 23. Each insulating film 24 has a dielectric constant higher than that of the silicon oxide film.

15 Claims, 2 Drawing Sheets

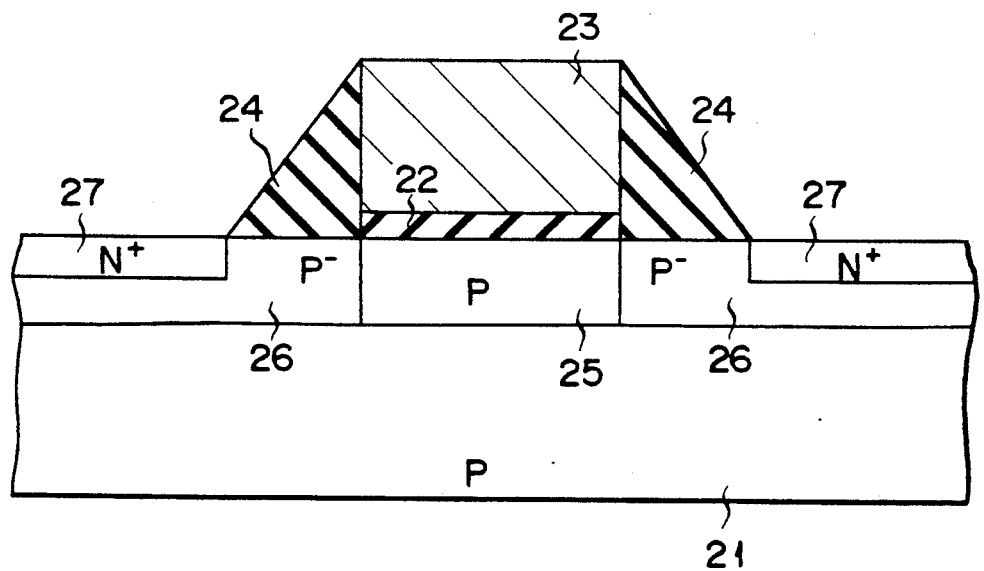
F I G. 3
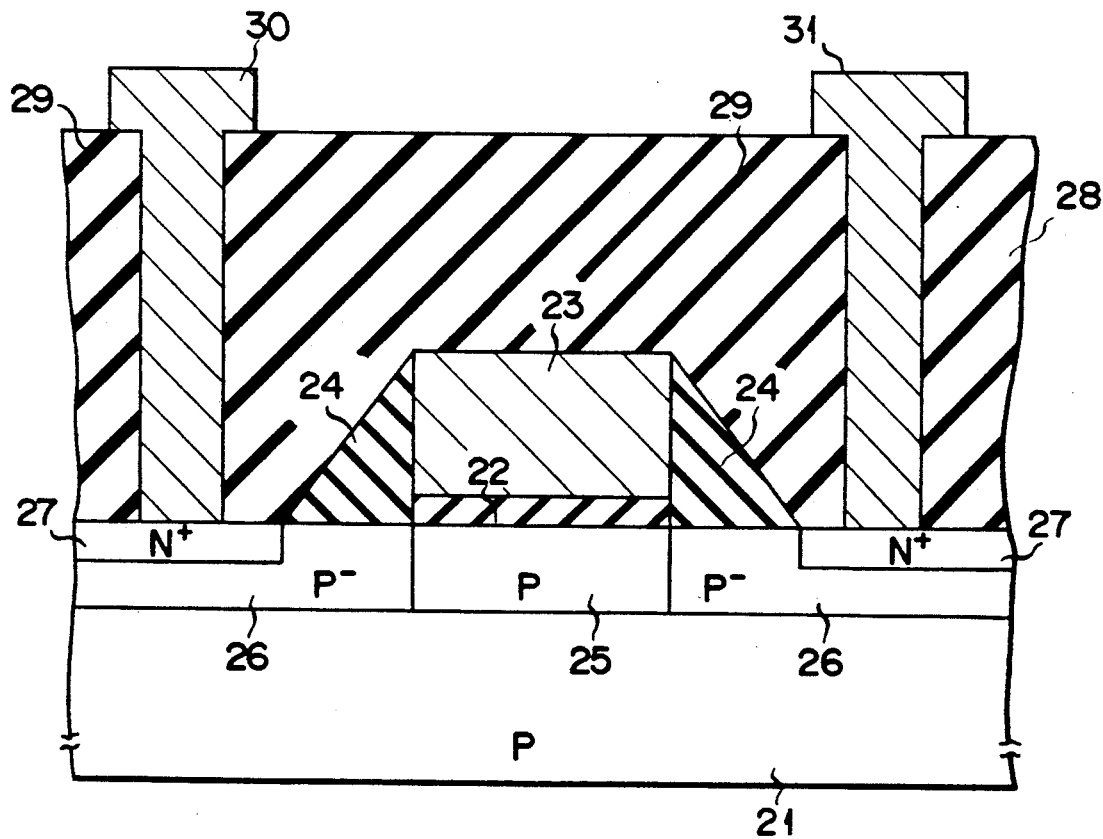
F I G. 4

MOS SEMICONDUCTOR DEVICE WITH HIGH DIELECTRIC CONSTANT SIDEWALL INSULATOR AND INDUCED SOURCE/DRAIN EXTENSION

BACKGROUND OF THE INVENTION

1. Field of the Invention

The present invention relates generally to a MOS semiconductor device, and more particularly to a MOS semiconductor device having a structure suitable for miniaturization.

2. Description of the Related Art

As a MOS transistor suitable for miniaturization, there is known a MOS transistor having an LDD (Lightly Doped Drain) structure. FIG. 1 shows an example of this type of transistor. A pair of N-type regions 12 and 13 with a high impurity concentration are formed on a surface region of, for example, a P-type semiconductor region 11. A pair of N-type regions 14 and 15 with a low impurity concentration are formed between the N-type regions 12 and 13 such that regions 14 and 15 are put in contact with regions 12 and 13, respectively.

The impurity concentration of the N-type regions 1 and 15 is low, and the diffusion depth thereof is small. By virtue of these features, a short channel effect can be suppressed, and a source-drain breakdown voltage can be enhanced. In addition, the gate electrode can be advantageously reduced in size.

In the MOS transistor having the above structure, however, if the effective channel length is reduced to less than about 0.5 $\mu$m, the short channel effect and source-drain breakdown voltage are deteriorated.

SUMMARY OF THE INVENTION

The object of the present invention is therefore to provide a MOS semiconductor device having an element structure suitable for higher miniaturization.

According to an aspect of the invention, there is provided a MOS semiconductor device comprising: a semiconductor substrate having a first conductivity type; a first insulating film formed on a selected portion of the substrate; a gate electrode formed on the first insulating film; a first semiconductor region formed in a surface region of the substrate under the first insulating film, and containing an impurity of the first conductivity type; a second insulating film formed in contact with a side wall of the gate electrode and partly in contact with the substrate, and having a dielectric constant higher than that of the first insulating film; and a second semiconductor region of the first conductivity type formed on that surface region of the substrate, which is in contact with the second insulating film, and containing an impurity of the first conductivity type, the concentration of the impurity being lower than that in the first semiconductor region.

According to another aspect of the invention, there is provided a MOS semiconductor device comprising: a semiconductor substrate having a first conductivity type; a first insulating film formed on a selected portion of the substrate; a gate electrode formed on the first insulating film; a first semiconductor region formed in a surface region of the substrate under the first insulating film, and containing an impurity of the first conductivity type; a pair of second insulating films formed in contact with a pair of side walls of the gate electrode and in contact with the substrate, and having a dielectric constant higher than that of the first insulating film; a pair of second semiconductor regions of the first conductivity type formed on that surface region of the substrate, which is in contact with the second insulating films, such that the second semiconductor regions sandwich the first semiconductor region, and each containing an impurity of the first conductivity type, the concentration of the impurity being lower than that in the first semiconductor region and a pair of third semiconductor regions formed in the surface regions of the substrate such that the third semiconductor regions adjoin the second semiconductor regions, and each containing an impurity of a second conductivity type.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a cross-sectional view of a MOS transistor according to a second embodiment of the invention; and FIG. 4 is a cross-sectional view showing a more detailed structure of the MOS transistor according to the second embodiment of the invention.

DETAILED DESCRIPTION OF THE PREFERRED EMBODIMENTS

Embodiments of the present invention will now be described with reference to the accompanying drawings.

Figure 1:
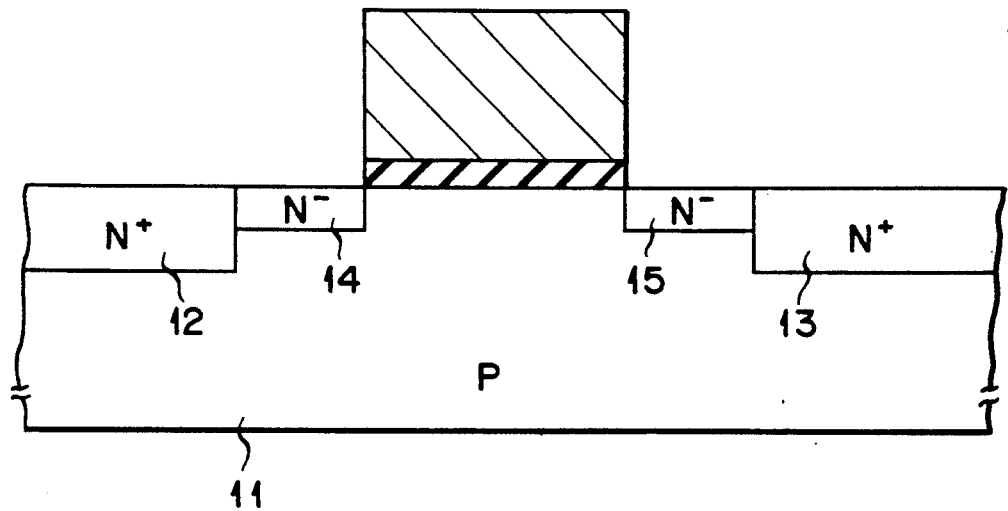
FIG. 1 is a cross-sectional view of a conventional MOS transistor.
Figure 2:
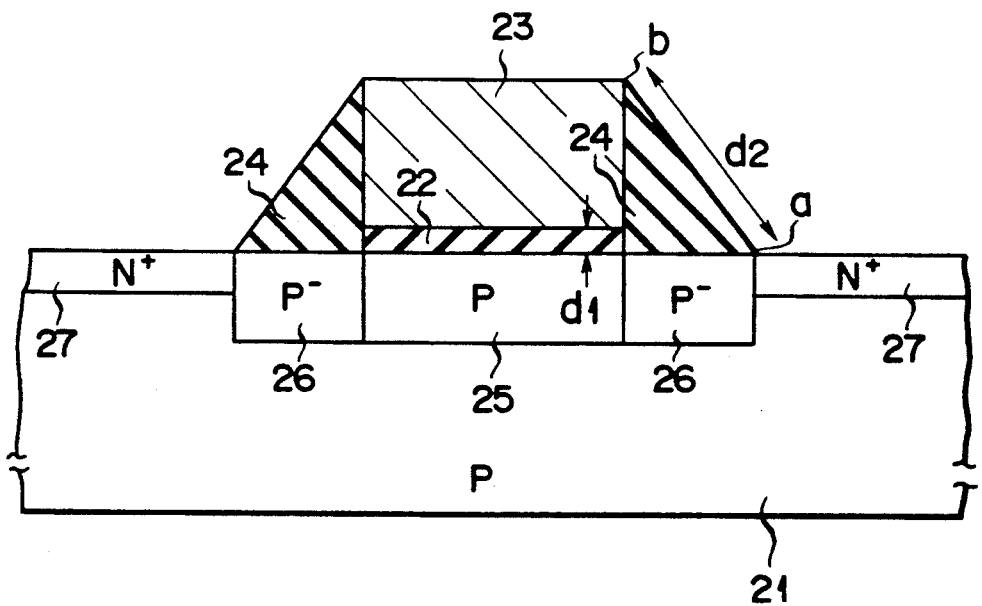
FIG. 2 is a cross-sectional view of a MOS transistor according to a first embodiment of the present invention.

FIG. 2 is a cross-sectional view of a MOS transistor according to the first embodiment of the invention. In FIG. 2, reference numeral 21 denotes a P-type silicon semiconductor substrate having a resistivity of, e.g. 5$\Omega$·cm. A gate insulating film 22 or a silicon oxide film, with a thickness d1 of 100 Å, is formed on a selected surface portion of the substrate 21. A gate electrode 23 is formed on the gate insulating film 22. The gate electrode 23 is made of an N-type polysilicon to which, for example, phosphorus is added as an impurity. Insulating films 24 of an insulating material having a dielectric constant higher than that of the silicon oxide film, for example, silicon nitride ($Si_3N_4$), are formed on a pair of opposite side walls of the gate electrode 23.

A P-type semiconductor region 25 is formed in a surface region of the substrate 21 under the gate insulating film 22. The region 25 has an impurity concentration of, e.g. about $1 \times 10^{17}(/cm^{-3})$. A pair of P-type semiconductor regions 26 are formed in surface regions of the substrate under the insulating films 24. The regions 26 sandwich the P-type semiconductor region 25, and each region 26 has an impurity concentration of, e.g.

about $3\times10^{14}(/\text{cm}^{-3})$. Further, a pair of N-type semiconductor regions 27, which become source and drain regions, are formed in surface regions of the substrate 21. The regions 27 adjoin the P-type semiconductor regions 26.

The thickness d2 of each insulating film 24 corresponds to a linear distance between a point a and a point b. The point a is a contact point between the P-type semiconductor region 26 and the N-type semiconductor region 27. The point b is the uppermost point of the side wall of the gate electrode 23 near the region 26. Specifically, the thickness d2 of the insulating film 2 is defined by the longest straight line connecting the gate electrode 23 and the N-type semiconductor region 27.

When the thickness of the gate electrode 23 is 3000 Å, the thickness d2 is about 3400 Å. The dielectric constant $\epsilon_1$ of the gate insulating film 22 made of silicon oxide film is about 3.5, and the dielectric constant $\epsilon_2$ of the insulating film 24 made of silicon nitride film is about 7.

According to this MOS transistor, the insulating films 24 have a high dielectric constant. Thus, when a predetermined voltage is applied to the gate electrode 23, N-type inversion layers are formed on the surfaces of both P-type semiconductor regions 26. The inversion layers function like low-concentration regions in a conventional LDD-structure transistor. Thus, by virtue of the formation of the inversion layers, a short channel effect is suppressed and the source-drain breakdown voltage is enhanced, as in the conventional LDD-structure transistor. In addition, the depth of each inversion layer from the substrate surface is about 100 Å and very small. In the conventional LDD-structure transistor, however, it was very difficult to reduce the depth of the low-concentration region to less than 0.1 μm because of the need to carry out impurity diffusion. The depth must be reduced as much as possible, in order to suppress the short channel effect. In the MOS transistor according to the above embodiment, the depth can be sufficiently reduced to about 100 Å. Thus, even if the effective channel length is more reduced, the short channel effect can be suppressed. This is advantageous in miniaturizing the gate electrode.

In the meantime, in the MOS transistor according to the above embodiment, a threshold voltage $V_{T1}$ of the semiconductor region 25 below the gate electrode 23 and a threshold voltage $V_{T2}$ of each semiconductor region 26 under the corresponding insulating film 24 can be controlled individually Specifically, the threshold voltage $V_{T1}$ is given by $$V_{T1} = V_{FB1} + 2\phi_{B1} + \frac{d1}{\epsilon_1} \sqrt{4\epsilon_s q N1 \phi_{B1}} \quad 1$$

where $V_{FB1}$ is the flat band voltage, $\phi_{B1}$ is the Fermi level of the semiconductor region 25 below the gate electrode 23, $\epsilon_s$ is the dielectric constant thereof, and q is the electronic charge.

On the other hand the threshold voltage $V_{T2}$ is given by $$V_{T2} = V_{FB2} + 2\phi_{B2} + \frac{d2}{\epsilon_2} \sqrt{4\epsilon_s q N2 \phi_{B2}} \quad 2$$

In normal cases, $V_{FB1} \approx V_{FB2}$ and $\phi_{B1} \approx \phi_{B2}$. Thus, a difference $\Delta V_T$ between $V_{T1}$ and $V_{T2}$ is given by $$\Delta V_T = V_{T1} - V_{T2} = \frac{d1}{\epsilon_1}\sqrt{4\epsilon_s q N1 \phi_s} - \frac{d2}{\epsilon_2}\sqrt{4\epsilon_s q N2 \phi_s} \quad 3$$

where $\phi_{B1} = \phi_{B2} = \phi_B$.

Here, the following relationship exists between the thickness d1 and dielectric constant $\epsilon_1$ of the gate insulating film 22, the thickness d2 and dielectric constant $\epsilon_2$ of the insulating film 24, the impurity concentration N1 of the P-type semiconductor region 25, and the impurity concentration N2 of the P-type semiconductor region 26:

$$N2 < N1 \left(\frac{\epsilon_2}{\epsilon_1} \cdot \frac{d1}{d2}\right)^2 \quad 4$$

Specifically, N2 is $3\times10^{14}(/\text{cm}^{-3})$, and the value of the right side is $1\times10^{17}(2\times 1/34)^2 \approx 3.46\times10^{14}$.

The following formulae 5 and 6 are obtained from the above formula 4:

$$\sqrt{\frac{N2}{N1}} < \frac{\epsilon_2}{\epsilon_1} \cdot \frac{d1}{d2} \quad 5$$

$$\frac{d2}{\epsilon_2}\sqrt{N2} < \frac{d1}{\epsilon_1}\sqrt{N1} \quad 6$$

Accordingly, the following relationship exists between the first and second terms of the right side of equation 3:

$$\frac{d2}{\epsilon_2}\sqrt{4\epsilon_s q N2 \phi_s} < \frac{d1}{\epsilon_1}\sqrt{4\epsilon_s q N1 \phi_s} \quad 7$$

In this case, the value of $\Delta V_T$ is greater than 0. In other words, when a voltage is applied to the gate electrode 23, inversion layers are always formed in the semiconductor regions 26 under the insulating films 24, prior to the formation of inversion layers in the region below the gate electrode 23. Thus, the characteristics of the transistor can be determined, with high controllability, by mainly the width of the gate electrode 23, the thickness of the gate insulating film 22, and the impurity concentration of the P-type semiconductor region 25 below the gate electrode.

A second embodiment of the present invention will now be described with reference to FIG. 3. According to the device of the second embodiment, the P-type semiconductor regions 26 are extended to the regions under the N-type semiconductor regions 27 which become the source and drain regions.

By virtue of this structure, the same effect as in the first embodiment can be obtained and the breakdown voltage between the substrate and the drain can be enhanced.

FIG. 4 is a cross-sectional view showing a more detailed structure of the MOS transistor according to the second embodiment shown in FIG. 3. An insulating film 28 comprising an inter-layer insulating film and a passivation film is deposited on the whole surface of the structure. Contact holes 29 are formed in the insulating film 28. The contact holes 29 reach the surfaces of the N-type semiconductor regions 27 which become the source and drain regions. A source electrode 30 and a drain electrode 31 are buried in the contact holes 29.

The present invention is not limited to the above embodiments, and various changes and modifications can, of course, be made without departing from the spirit of the present invention. For example, in the above embodiments, the insulating films 24 formed on the side walls of the gate electrode 23 are silicon nitride films having a dielectric constant higher than that of silicon oxide film; however, the silicon nitride films may be replaced by any material having a dielectric constant higher than that of silicon oxide film. For example, in addition to silicon nitride films, there can be used insulating films made of metal oxides. If tantalum oxide (Ta$_2$O$_5$) having a dielectric constant of about 30 is employed, the impurity concentration of each P-type semiconductor region 26 is set at about $5 \times 10^{15}(/\text{cm}^{-3})$ or less. As a metal oxide of the insulating film, it is possible to use, in addition to tantalum oxide, strontium titanate (SrTiUO$_3$), hafnium-titanium-zirconium oxide, etc.

The above embodiments were directed to the N-channel MOS transistor formed on the P-type silicon semiconductor substrate. However, the P-type silicon substrate may be replaced by a P-type well formed in an N-type substrate. In addition, a P-channel MOS transistor may be constituted in an N-type well region formed in an N-type silicon substrate or a P-type substrate.

As has been described above, the present invention can provide a MOS semiconductor device having an element structure suitable for higher miniaturization.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A MOS semiconductor device comprising:
   a semiconductor substrate having a first conductivity type;
   a first insulating film formed on a selected portion of the substrate;
   a gate electrode formed on the first insulating film;
   a first semiconductor region formed in a surface region of the substrate under the first insulating film, and containing an impurity of the first conductivity type;
   a second insulating film formed in contact with a side wall of the gate electrode and partly in contact with the substrate, and having a dielectric constant higher than that of the first insulating film;
   a second semiconductor region of the first conductivity type formed on that surface region of the substrate, which is in contact with the second insulating film, and containing an impurity of the first conductivity type, the concentration of the impurity being lower than that in the first semiconductor region.

2. The MOS semiconductor device according to claim 1, wherein in the case where the thickness and dielectric constant of the first insulating film are d1 and $\epsilon_1$, the thickness and dielectric constant of the second insulating film are d2 and $\epsilon_2$, the impurity concentration of the first semiconductor region is N1 and the impurity concentration of the second semiconductor region is N2, the values of these parameters are set to meet the following relationship:

$$\frac{N1}{N2} > \left( \frac{\epsilon 1}{\epsilon 2} \cdot \frac{d2}{d1} \right)^2.$$

3. The MOS semiconductor device according to claim 2, wherein the impurity concentration of the first semiconductor region is set at about $1 \times 10^{17}(/\text{cm}^{-3})$, and the impurity concentration of the second semiconductor region is set at about $3 \times 10^{14}(/\text{cm}^{-3})$.

4. The MOS semiconductor device according to claim 1, wherein said first insulating film is formed of a silicon oxide film.

5. The MOS semiconductor device according to claim 1, wherein said second insulating film is formed of a silicon nitride film.

6. The MOS semiconductor device according to claim 1, wherein said second insulating film is formed of a metal oxide film.

7. The MOS semiconductor device according to claim 6, wherein said metal oxide film is a tantalum oxide film.

8. The MOS semiconductor device according to claim 6, wherein said metal oxide film is a strontium titanate film.

9. A MOS semiconductor device comprising:
   a semiconductor substrate having a first conductivity type;
   a first insulating film formed on a selected portion of the substrate;
   a gate electrode formed on the first insulating film;
   a first semiconductor region formed in a surface region of the substrate under the first insulating film, and containing an impurity of the first conductivity type;
   a pair of second insulating films formed in contact with a pair of side walls of the gate electrode and in contact with the substrate, and having a dielectric constant higher than that of the first insulating film;
   a pair of second semiconductor regions of the first conductivity type formed on that surface region of the substrate, which is in contact with the second insulating films, such that the second semiconductor regions sandwich the first semiconductor region, and each containing an impurity of the first conductivity type, the concentration of the impurity being lower than that in the first semiconductor region; and
   a pair of third semiconductor regions formed in the surface regions of the substrate such that the third semiconductor regions adjoin the second semiconductor regions, and each containing an impurity of a second conductivity type.

10. The MOS semiconductor device according to claim 9, wherein in the case where the thickness and dielectric constant of the first insulating film are d1 $\epsilon_1$, the thickness and dielectric constant of each second insulating film are d2 and $\epsilon_2$, the impurity concentration of the first semiconductor region is N1 and the impurity concentration of each second semiconductor region is N2, the values of these parameters are set to meet the following relationship:

$$\frac{N1}{N2} > \left( \frac{\epsilon 1}{\epsilon 2} \cdot \frac{d2}{d1} \right)^2.$$

11. The MOS semiconductor device according to claim 9, wherein said first insulating film is formed of a silicon oxide film.

12. The MOS semiconductor device according to claim 9, wherein each of said second insulating films is formed of a silicon nitride film.

13. The MOS semiconductor device according to claim 9, wherein each of said second insulating films is formed of a metal oxide film.

14. The MOS semiconductor device according to claim 13, wherein said metal oxide film is a tantalum oxide film.

15. The MOS semiconductor device according to claim 13, wherein said metal oxide film is a strontium titanate film.

* * * * *